US009261901B2

(12) United States Patent
Truong

(10) Patent No.: US 9,261,901 B2
(45) Date of Patent: Feb. 16, 2016

(54) TURNTABLE STAND ASSEMBLY AND MONITOR

(71) Applicant: Lenovo (Singapore) Pte. Ltd., Singapore (SG)

(72) Inventor: Cuong Huy Truong, Cary, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 227 days.

(21) Appl. No.: 13/895,319

(22) Filed: May 15, 2013

(65) Prior Publication Data

US 2014/0340828 A1    Nov. 20, 2014

(51) Int. Cl.
| G06F 1/16 | (2006.01) |
| H05K 5/00 | (2006.01) |
| H05K 7/00 | (2006.01) |
| A47F 5/12 | (2006.01) |
| F16F 5/00 | (2006.01) |
| H05K 7/16 | (2006.01) |
| A47F 5/00 | (2006.01) |
| E04G 3/00 | (2006.01) |
| G06F 1/20 | (2006.01) |
| F28F 13/00 | (2006.01) |

(52) U.S. Cl.
CPC ............... G06F 1/1601 (2013.01); G06F 1/16 (2013.01); H05K 7/16 (2013.01); A47F 5/00 (2013.01); A47F 5/12 (2013.01); E04G 3/00 (2013.01); F28F 13/00 (2013.01); G06F 1/20 (2013.01); G06F 2200/1631 (2013.01)

(58) Field of Classification Search
CPC ........... G01F 1/16; G01F 1/1601; G01F 1/20; H05K 7/16; A47F 5/00; A47F 5/12; E04G 3/00; G06F 1/20; F28F 13/00
USPC ............. 361/679.06, 679.22, 679.09, 679.21, 361/679.26–679.28; 248/133, 917, 918, 248/921–923; 267/64.12
See application file for complete search history.

(56) References Cited

U.S. PATENT DOCUMENTS

| 5,842,672 | A | * | 12/1998 | Sweere et al. | ............. 248/278.1 |
| 6,288,891 | B1 | * | 9/2001 | Hasegawa et al. | ........ 361/679.07 |
| 7,198,237 | B2 | * | 4/2007 | Cho et al. | ....................... 248/133 |
| 7,532,463 | B2 | * | 5/2009 | Jacobs et al. | ............. 361/679.48 |
| 2007/0095993 | A1 | * | 5/2007 | Yamamoto | .................. 248/284.1 |
| 2013/0319638 | A1 | * | 12/2013 | Degner et al. | ............. 165/104.21 |

* cited by examiner

Primary Examiner — Courtney Smith
Assistant Examiner — Zhengfu Feng
(74) Attorney, Agent, or Firm — Brian J. Pangrle

(57) ABSTRACT

A system can include a platform; a turntable coupled to the platform for rotation of the platform about a vertical axis; a support that includes a column, an extension and an arm joint disposed on the extension, where the column extends vertically from the platform and where the extension extends from the column at an angle and positions the arm joint vertically above the platform and toward a perimeter of the platform; a monitor mount that includes an arm joint; a monitor that includes a computing device and a touch screen, the monitor being mountable to the monitor mount; and an arm coupled at a pivot end to the arm joint of the support and coupled at a free end to the arm joint of the monitor mount, which is pivotable about the free end of the arm. Various other apparatuses, assemblies, systems, methods, etc., are also disclosed.

17 Claims, 12 Drawing Sheets

TURNTABLE STAND ASSEMBLY AND MONITOR

TECHNICAL FIELD

Subject matter disclosed herein generally relates to assemblies for monitors and monitors.

BACKGROUND

As visual interfaces continually evolve for display of information, touch input, etc., users are demanding more flexible ergonomic systems to support such interfaces. For example, consider a monitor that can display information as well as optionally operate as a touch screen keyboard, drafting table, etc. At times, a user may desire an ergonomic configuration better suited to visualization of information while, at other times, a user may desire an ergonomic configuration better suited to touch input. As described herein, various assemblies can provide for flexible ergonomics.

SUMMARY

A system can include a horizontal platform that includes a perimeter and a vertical axis; a circular turntable coupled to the horizontal platform for rotation of the platform about the vertical axis; a support that includes a column, an extension and an arm joint disposed on the extension, where the column extends vertically from the horizontal platform and where the extension extends from the column at an acute angle and positions the arm joint vertically above the horizontal platform and toward the perimeter of the horizontal platform; a monitor mount that comprises an arm joint; a monitor that includes a computing device and a touch screen, the monitor being mountable to the monitor mount; and an arm coupled at a pivot end to the arm joint of the support and coupled at a free end to the arm joint of the monitor mount, the monitor mount being pivotable about the free end of the arm. Various other apparatuses, assemblies, systems, methods, etc., are also disclosed.

BRIEF DESCRIPTION OF THE DRAWINGS

Features and advantages of the described implementations can be more readily understood by reference to the following description taken in conjunction with examples of the accompanying drawings.

DETAILED DESCRIPTION

The following description includes the best mode presently contemplated for practicing the described implementations. This description is not to be taken in a limiting sense, but rather is made merely for the purpose of describing the general principles of the implementations. The scope of the invention should be ascertained with reference to the issued claims.

Figure 1:
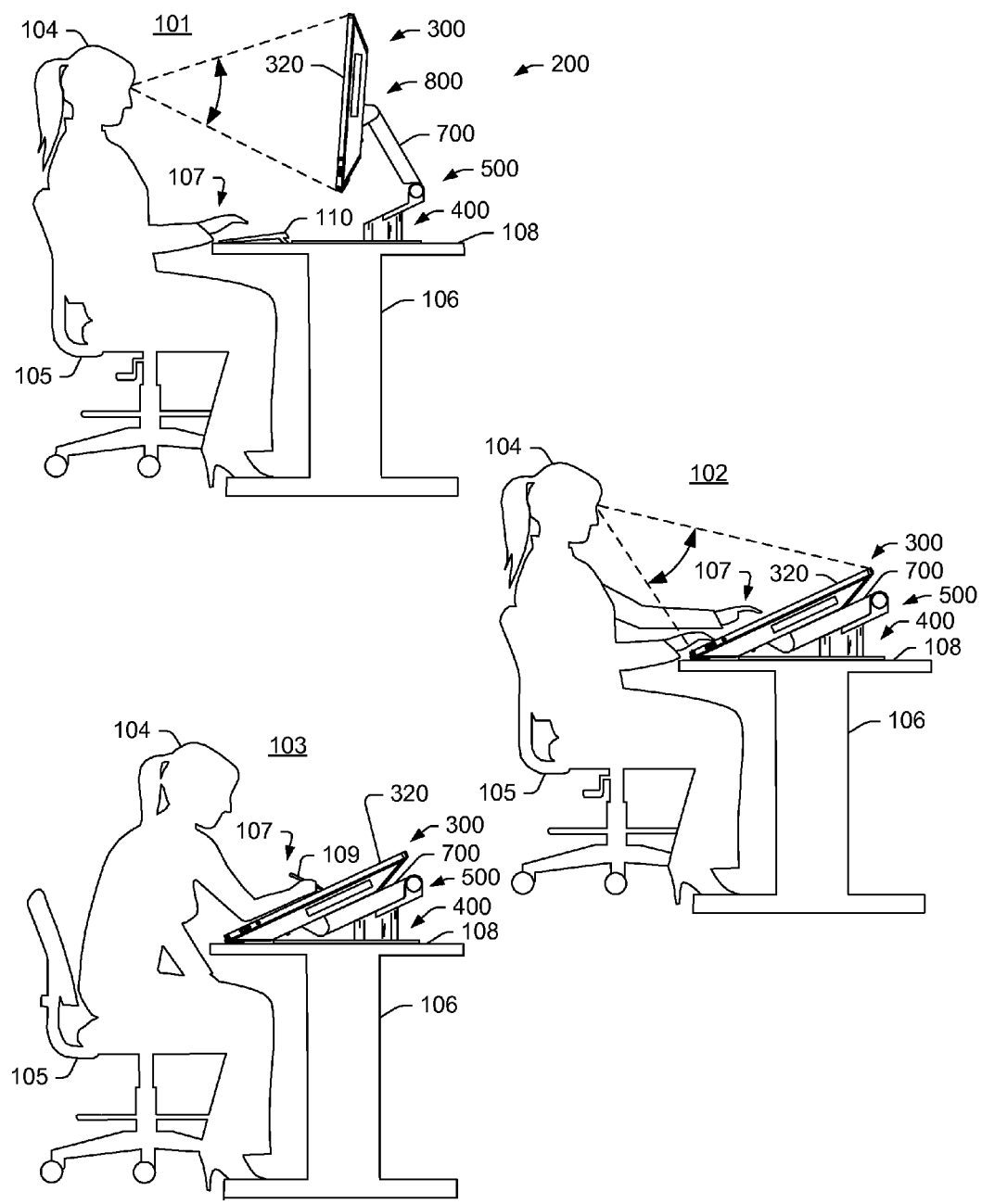
FIG. 1 is a diagram of examples of three scenarios for usage of an example of a monitor mounted to an assembly.

FIG. 1 shows example scenarios 101, 102 and 103 where a user 104 is seated in a chair 105 before a table 106 with a surface 108 that an assembly 200 and a monitor 300 with a screen 320 (e.g., a display surface). As shown, the assembly 200 can include a platform 400 (e.g., to support the assembly 200 on a surface such as the surface 108 of the table 106) and a support 500 that supports a pivotable arm 700 that includes a mount 800 for mounting the monitor 300 to the assembly 200. The assembly 200 provides for positioning of the monitor 300, for example, in a free orientation as shown in the scenario 101 and in touch mode orientations as shown in the scenarios 102 and 103 (e.g., the monitor 300 may be configured with touch circuitry for making the screen 320 a touch screen). As an example, the monitor 300 may include a computing device and a touch screen (e.g., via touch circuitry such as a capacitive touch circuitry or other touch circuitry).

For the scenario 101, a keyboard 110 may be provided for input of characters, commands, etc. For the scenario 102, the user 104 may use one or both of her hands 107 to touch the screen 320 for input of commands, information, etc. For the scenario 103, the user 104 may hold a stylus 109 and position the stylus 109 with respect to screen 320 for input of commands, information, etc. For example, the user 104 may touch the screen 320 with the stylus 109 to select one or more controls, to draw, etc.

As shown, for the scenarios 101, 102 and 103, the user 104 may have an angle of view (or view angle) for comfortably viewing the screen 320. As an example, the assembly 200 can allow for various adjustments to enhance ergonomics of a user's environment (e.g., depending on user comfort, tasks, etc.). Such adjustments may be achieved quickly and easily via a user's hand or hands, even while the user may remain seated. For example, the user 104 in scenario 101 may set the keyboard 110 aside, grab the monitor 300 with both hands and tilt it to achieve a touch mode orientation, per the scenario 102 or the scenario 103. As necessary, the user 104 may extend the monitor 300 as mounted to the assembly 200 forward to readily allow for touching with her hands 107 part of the screen 320 or the entire screen 320 per the scenario 102. As an example, the user 104 may hold an implement such as the stylus 109 to enter information or select one or more controls, regions, etc. displayed via the screen 320 per the scenario 103. As shown, the user 104 may achieve a suitable ergonomic environment for the scenarios 101, 102 and 103, optionally without adjustment to the chair 105 or the table 106.

Figure 2:
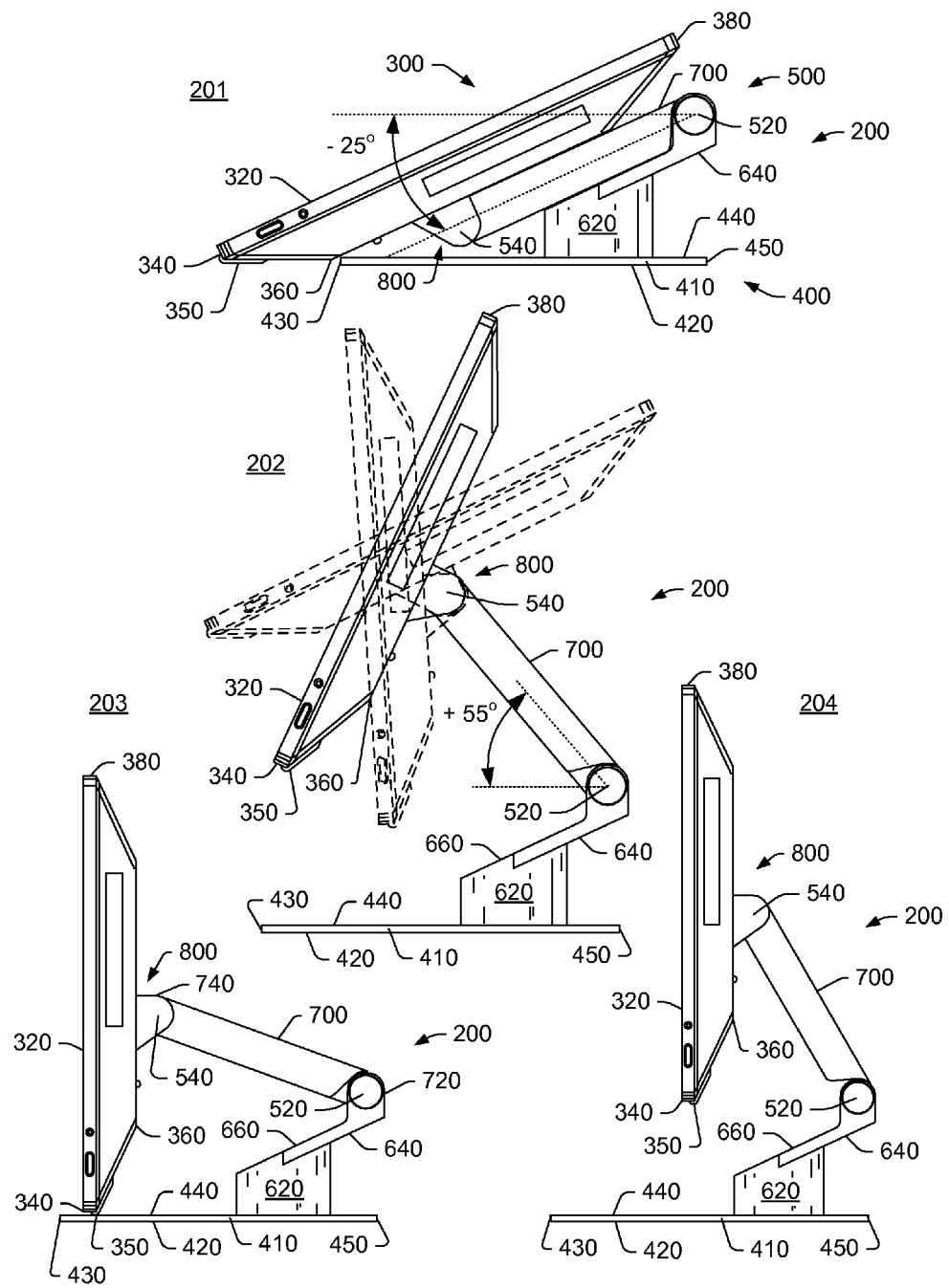
FIG. 2 is a diagram of examples of four scenarios for usage of an example of a monitor mounted to an assembly.

FIG. 2 shows various views of the assembly 200 with the monitor 300 in orientations 201, 202, 203 and 204. As an example, a system can include the assembly 200 and the monitor 300. For example, a system can include the platform 400, the support 500, the arm 700 and the mount 800 with the monitor 300 mounted to the mount 800.

As shown in the example of FIG. 2, the platform 400 may be oriented horizontally and include an edge 410 disposed between a lower surface 420 and an upper surface 440 where the edge 410 includes a front end 430 and a back end 450. As an example, the edge 410 may be a perimeter of the platform 400, which may define an area or footprint for the platform 400. In the example orientations 201, 202, 203 and 204, the center of mass of the monitor 300, which may have a mass that exceeds that of the assembly 200, remains above the area or footprint of the platform 400.

As an example, the platform 400 can include a midpoint located approximately halfway between the front end 430 and the back end 450, which may define, in part, location of the support 500 as attached to the platform 400. Further, as an example, the midpoint may define, in part, a range for orientations of the monitor 300, for example, where, in possible vertical orientations of the monitor 300, the screen 320 of the monitor remains fore of the midpoint of the platform 400 (e.g., and aft of the front end 430 of the platform 400).

As shown in the example of FIG. 2, the support 500 can include a column 620, an extension 640 and an arm joint 520 disposed on the extension 640 where the column 620 extends vertically from the horizontal platform 400 and where the extension 640 extends from the column 620 at an acute angle and positions the arm joint 520 vertically above the horizontal platform 400 and toward the back end 450 of the horizontal platform 400. In the example of FIG. 2, the support 500 includes a surface 660, for example, that extends at an angle with respect to the horizontally oriented platform 400. Such a surface may act as a stop surface, for example, to form a contact with a surface of the arm 700 to limit pivoting of the arm 700 in the arm joint 520 and, for example, to support the weight of the arm 700 and a monitor attached thereto via the mount 800.

As shown in the example of FIG. 2, the mount 800 may be a monitor mount for mounting of the monitor 300 that includes an arm joint 540 and the arm 700 can include a pivot end 720 and a free end 740 where the arm 700 can be coupled at the pivot end 720 to the arm joint 520 of the support 500 and coupled at the free end 740 to the arm joint 540 of the monitor mount 800, for example, where the monitor mount 800 is pivotable about the free end 740 of the arm 700 (e.g., via the arm joint 540). As an example, in the touch mode orientation 201, the arm 700 may contact, on a lower side, an upper surface of the support 500 (consider, e.g., the surface 660) and may contact, on an upper side, a back side surface of a monitor mounted to the arm 700 via the mount 800. In such an example, the weight of the monitor may be transferred to the upper surface of the support 500 via the arm 700.

As shown in the example of FIG. 2, the monitor 300 includes a bottom edge 340, a top edge 380 and a back side edge 360 where a bumper 350 (or bumpers) are mounted to the monitor 300, for example, at the bottom edge 340 and extending toward the back side edge 360. In the touch mode orientation 201, the bumper 350 may contact, along a first side, a surface such as the surface 108 of the table 106 on which the platform 400 is supported. In such an example, the monitor 300 may be supported via contact with the arm 700 and via bumper contact with another surface that supports the platform 400. In the vertical orientation 203, the bumper 350 may contact, along a second side, the upper surface 440 of the platform 400. In such an example, the monitor 300 may be supported, in part, via bumper contact with the upper surface 400 of the platform 400. As to the free orientations 202 and 204, the monitor 300 is supported by the arm 700, as connected to the support 500, which is attached to the platform 400. Thus, the example orientations of FIG. 2 include some with bumper contact (e.g., the orientations 201 and 203) and some without bumper contact (e.g., the orientations 202 and 204).

As an example, the assembly 200 may include a minimum pivot angle for the arm 700 and a maximum pivot angle for the arm 700. For example, the minimum pivot angle may be approximately minus 25 degrees with respect to a horizontal plane passing through the arm joint 520 that is substantially parallel to the horizontally oriented platform 400 and, for example, the maximum pivot angle may be approximately 55 degrees with respect to a horizontal plane passing through the arm joint 520 that is substantially parallel to the horizontally oriented platform 400. In such an example, the arm 700 may pivot in a range of approximately 80 degrees (e.g., from about minus 25 degrees to about 55 degrees). As an example, a minimum pivot angle may be defined by contact between a contact surface of the arm 700 and a contact surface of the support 500 (see, e.g., the surface 660). As an example, a maximum pivot angle may be defined by a stop mechanism of the arm joint 520.

Figure 3:
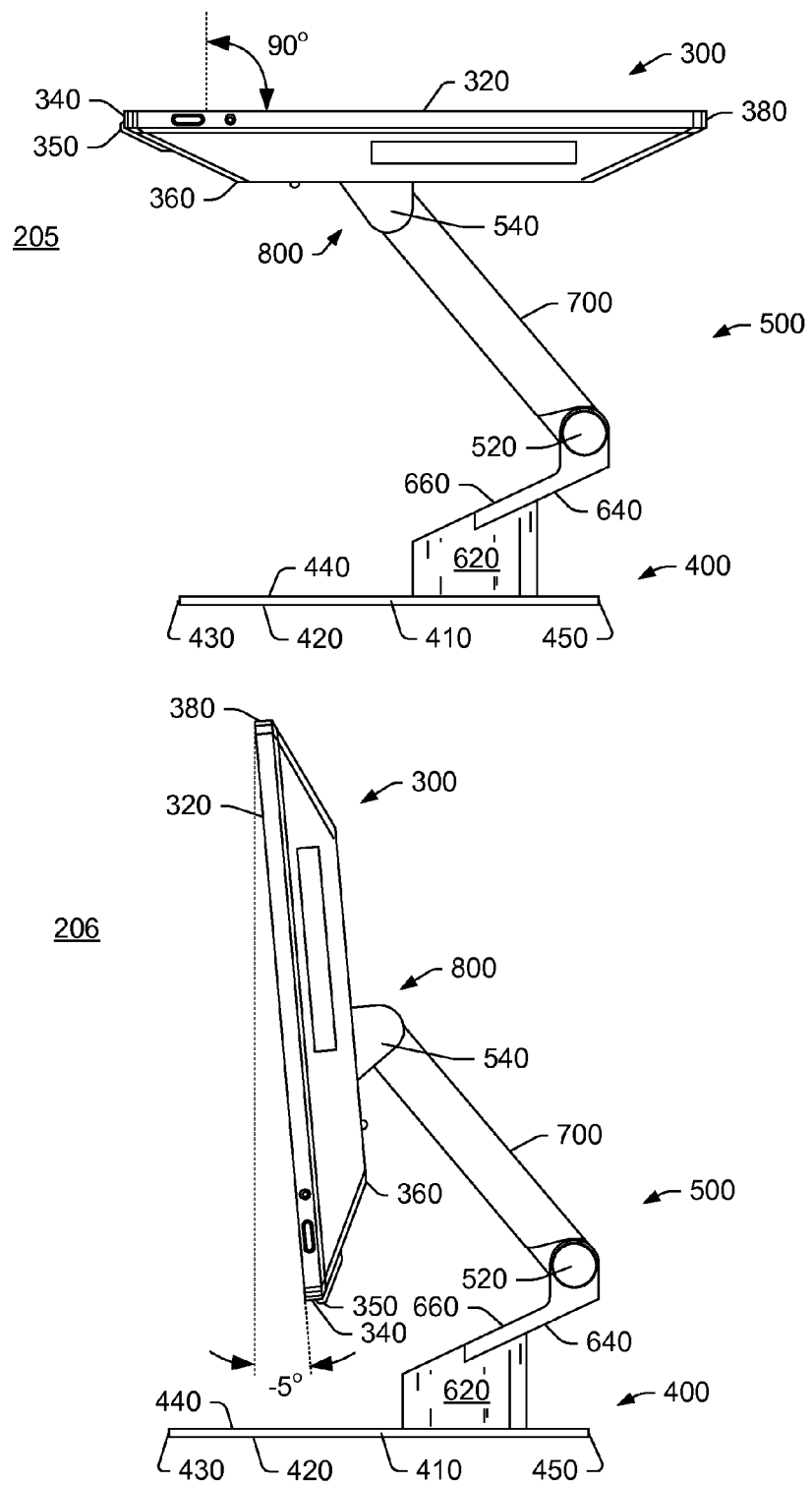
FIG. 3 is a diagram of examples of two scenarios for usage of an example of a monitor mounted to an assembly.

FIG. 3 shows the assembly 200 and the monitor 300 of FIG. 2 in two additional orientations 205 and 206. In the example of FIG. 3, the orientation 205 may be referred to as a table orientation where the arm 700 supports the monitor 300 substantially parallel to the horizontal platform 400, for example, at a maximum pivot angle of the arm 700 about the arm joint 520 of the support 500. As to the orientation 206, it is a free orientation where the arm 700 supports the monitor 300 and where the monitor 300 is pivoted about the arm joint 540 at an angle of approximately minus 5 degrees with respect to vertical (e.g., using the horizontally oriented platform 400 as a reference). As an example, in the table orientation 205, one or more tokens may be positioned on the screen 320 of the monitor 300. For example, a passive token, an active token or a combination of passive and active tokens may be positioned on the screen 320 (e.g., for playing a game, etc.). As an example, a table orientation may allow for multiple users to interact with the monitor 300, for example, via touching the screen 320 (e.g., where the users may be seat about the monitor 300).

In the example orientations 205 and 206, the center of mass of the monitor 300, which may have a mass that exceeds that of the assembly 200, remains above the area or footprint of the platform 400.

Figure 4:
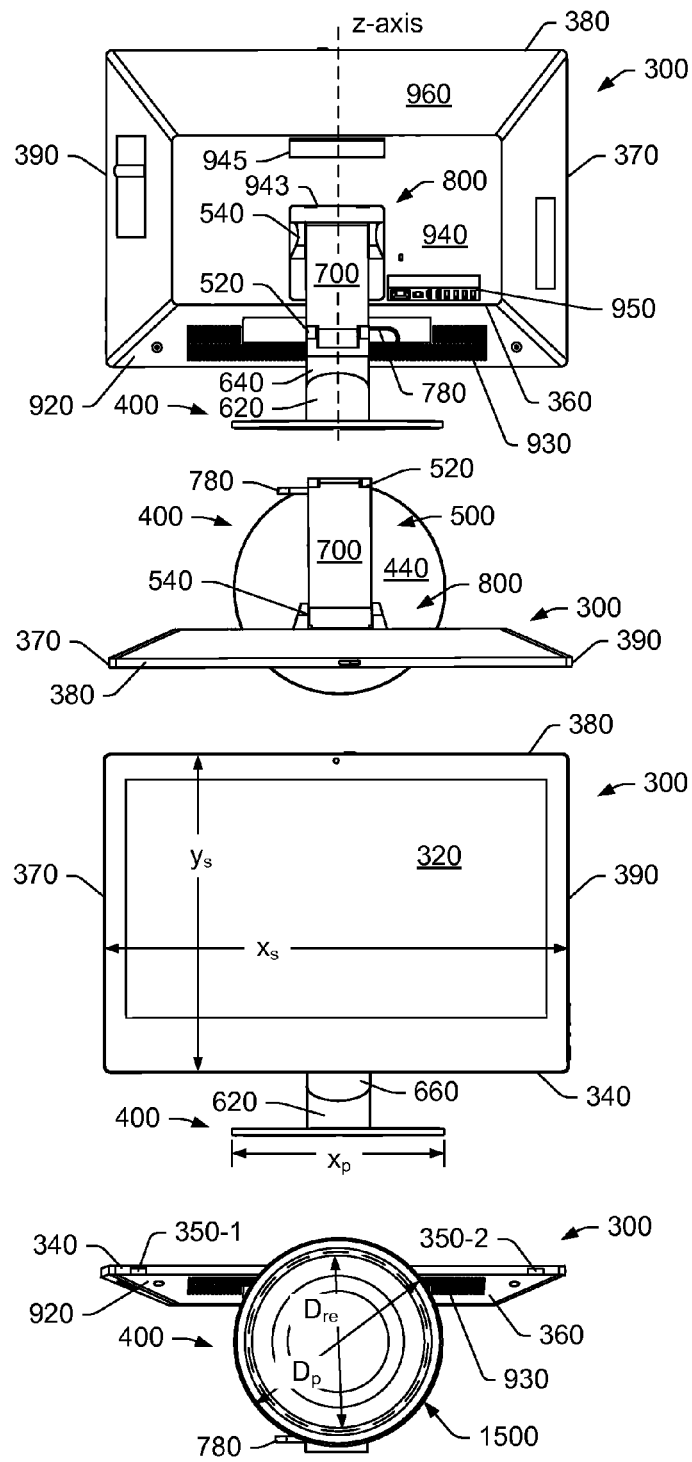
FIG. 4 is a series of views of an example of a monitor mounted to an assembly.

FIG. 4 shows various views of the assembly 200 and the monitor 300 where the assembly 200 includes a turntable 1500 for rotation of the platform 400, for example, about a vertical axis of the platform 400. In a bottom plan view (lower view), a diameter ($D_p$) of the platform 400 and a diameter ($D_{re}$) of a socket for rolling elements of the turntable 1500 are shown where the diameter ($D_{re}$) of the socket (e.g., formed by an upper race and a lower race) for rolling elements of the turntable 1500 is slightly less than the diameter ($D_p$) of the platform 400. For example, $D_{re}$ of the turntable 1500 may be selected to be at least 80% of $D_p$ of the platform 400 (e.g., to aid stability, smoothness of rotation, stress distribution, etc.).

In FIG. 4, the bottom plan view also shows two bumpers 350-1 and 350-2 as being attached to the monitor 300, which may be optional. Where provided, the bumpers 350-1 and 350-2 may provide some resistance to rotation via contact with a support surface such as the surface 108 of the table 106 of FIG. 1. In such an example, for various orientations, the bumpers 350-1 and 350-2 may aid in rotating the platform 400 to a particular angle and maintaining that angle (e.g., for viewing of the screen 320 of the monitor 300). For example, the turntable 1500 may allow the platform 400 to be freely rotatable such that gentle force causes the platform 400 to readily spin. In such an example, for a touch mode orientation (see, e.g., the touch mode orientation in the scenarios 102 and 103 of FIG. 1), touches to the screen 320 may therefore result in undesirable rotation of the platform 400. However, where one or more bumpers are provided that contact a support surface (see, e.g., the surface 108), the platform 400 may be more resistant to undesired rotation via frictional force achieved by such contact. As an example, a bumper may be made of a material that is "grippy" with respect to a wood surface, a ceramic surface, a glass surface, a synthetic surface, etc. to provide resistance to sweeping movement across such surfaces (e.g., via frictional force).

In a front plan view, the monitor 300 is shown as having a width ($x_s$) and a height ($y_s$), which may define a front area of the monitor 300 (e.g., between the bottom edge 340, the top edge 380, a first side edge 370 and a second side edge 390), and the platform 400 is shown as having a width ($x_p$). As an example, the monitor 300 may have a frontal surface area that exceeds the area or footprint of the platform 400 and, for example, the mass of the monitor 300 may exceed that of the platform 400 (e.g., including the turntable 1500). As an example, a smaller footprint may help to preserve useable desk area.

FIG. 4 also shows the support 500 as including a cable guide 780 as extending outwardly from the arm joint 520, for example, to guide one or more cables connected to the monitor 300, for example, as the monitor 300 is being positioned in a particular orientation.

In FIG. 4, a back plan view and the bottom plan view, the back side of the monitor 300 is shown as including surfaces 920, 940 and 960 as well as vents 930 and a connector recess 950, which includes connector sockets disposed at an angle (see, e.g., the angle φ in FIG. 6) for connecting one or more cables, etc. to the monitor 300. In the example of FIG. 4, the back side edge 360 is part of a perimeter of the back side surface 940, which includes a recess 943 for receipt of a portion of the mount 800 and a recess 945, for example, for receipt of a hand to help carry, mount, position, etc. the monitor 300. As shown, the surface 960 slopes from the perimeter to the top edge 380 and the surface 920 slopes from the perimeter to the bottom edge 340.

Figure 5:
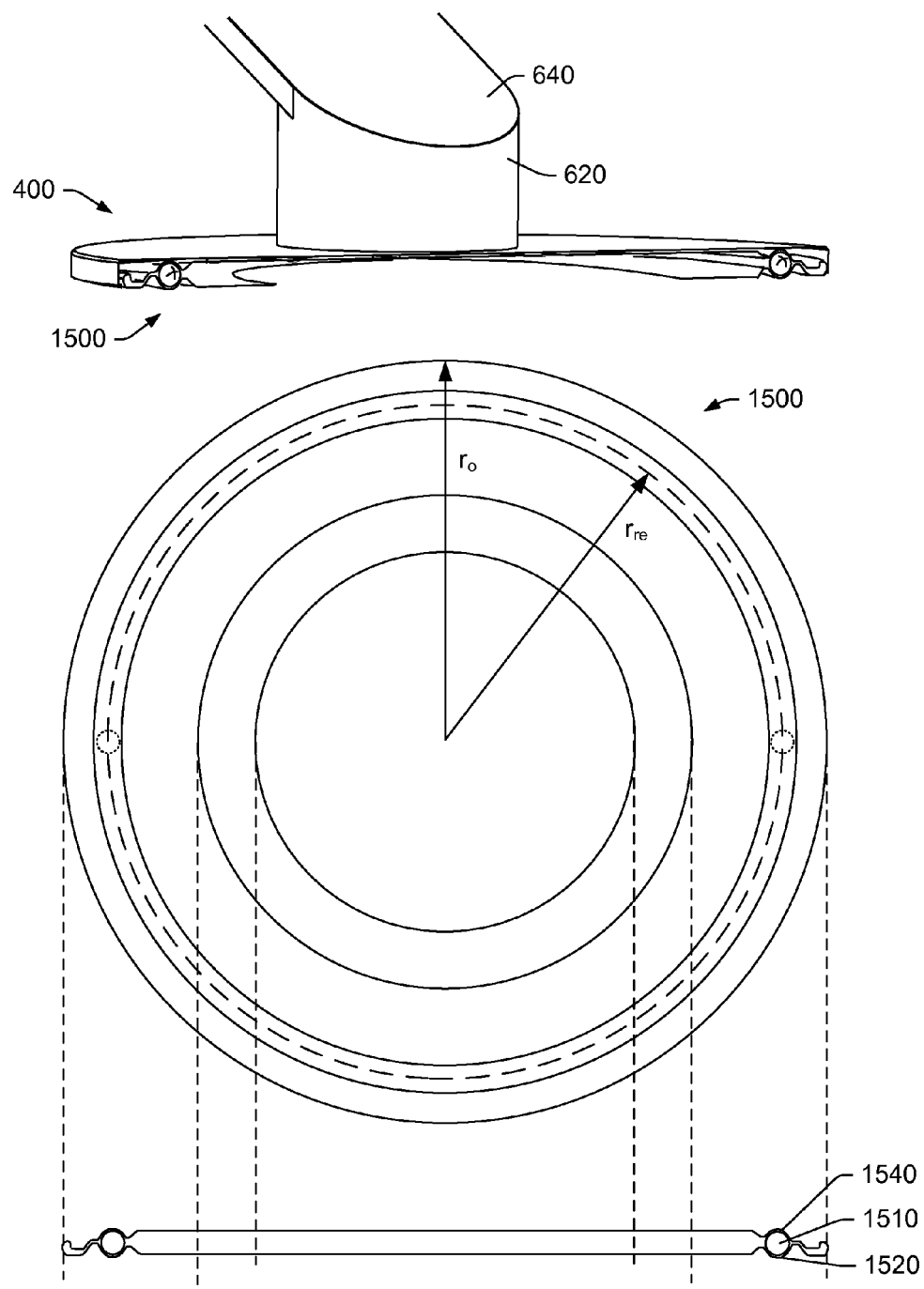
FIG. 5 is a series of views of an example of a turntable.

FIG. 5 shows a perspective cut-away view of a portion of the assembly 200 including the turntable 1500 and a plan view and a cut-away view of the turntable 1500. In the example of FIG. 5, the turntable 1500 includes rolling elements 1510 disposed in a socket formed by a lower race 1520 and an upper race 1540. To rotatably support the platform 400, the platform 400 may be connected to the upper race 1540, which is configured to be freely rotatable with respect to the lower race 1520 via the rolling elements 1510. As an example, the upper race 1540 may be bolted, press-fit, welded, etc. to the platform 400. As an example, the turntable 1500 may include one or more openings that provide access to the column 620, for example, where the column 620 is bolted, screwed, etc. to the platform 400. Given such an arrangement, the socket formed by the lower race 1520 and the upper race 1540 may be protected to help prevent debris from entering the socket (e.g., consider a metal to metal low-friction seal between a portion of the lower race 1520 and a portion of the upper race 1540).

In the example of FIG. 5, the turntable 1500 has an outer radius ($r_o$) and a socket radius ($r_{re}$) for the socket that receives the rolling elements 1510. As shown, the radius $r_{re}$ is approximately at least 80% of the radius $r_o$ and approximately 90% of the radius $r_o$. As an example, the radius $r_o$ may be approximately the same as an outer radius of the platform 400, for example, to thereby locate the socket of the turntable 1500 and the rolling elements 1510 therein relatively close to the outer radius of the platform 400.

As an example, the turntable 1500 may include the lower race 1520 and the upper race 1540 formed of metal. As an example, the rolling elements 1510 may be formed of metal or ceramic. As an example, the lower race 1520 and/or the upper race 1540 may be cast, stamped, etc. As an example, a piece of sheet metal may be stamped to form the lower race 1520 and another piece of sheet metal may be stamped to form the upper race 1540 where they are then freely "joined" at or near their ends to form the socket for the rolling elements (e.g., as positioned in the socket during or prior to the joining process). Such a joining process aims to secure the rolling elements 1510 rotatably in the socket while allowing the upper race 1540 to rotate freely with respect to the lower race 1520.

As an example, the lower race 1520 may provide a support surface or may be connected to another component of the turntable 1500 that forms a support surface upon which the platform 400 may be supported. As an example, the lower race 1520 may be positioned on a table, a desk, etc. to remain stationary while the upper race 1540 rotates along with the platform 400.

Figure 6:
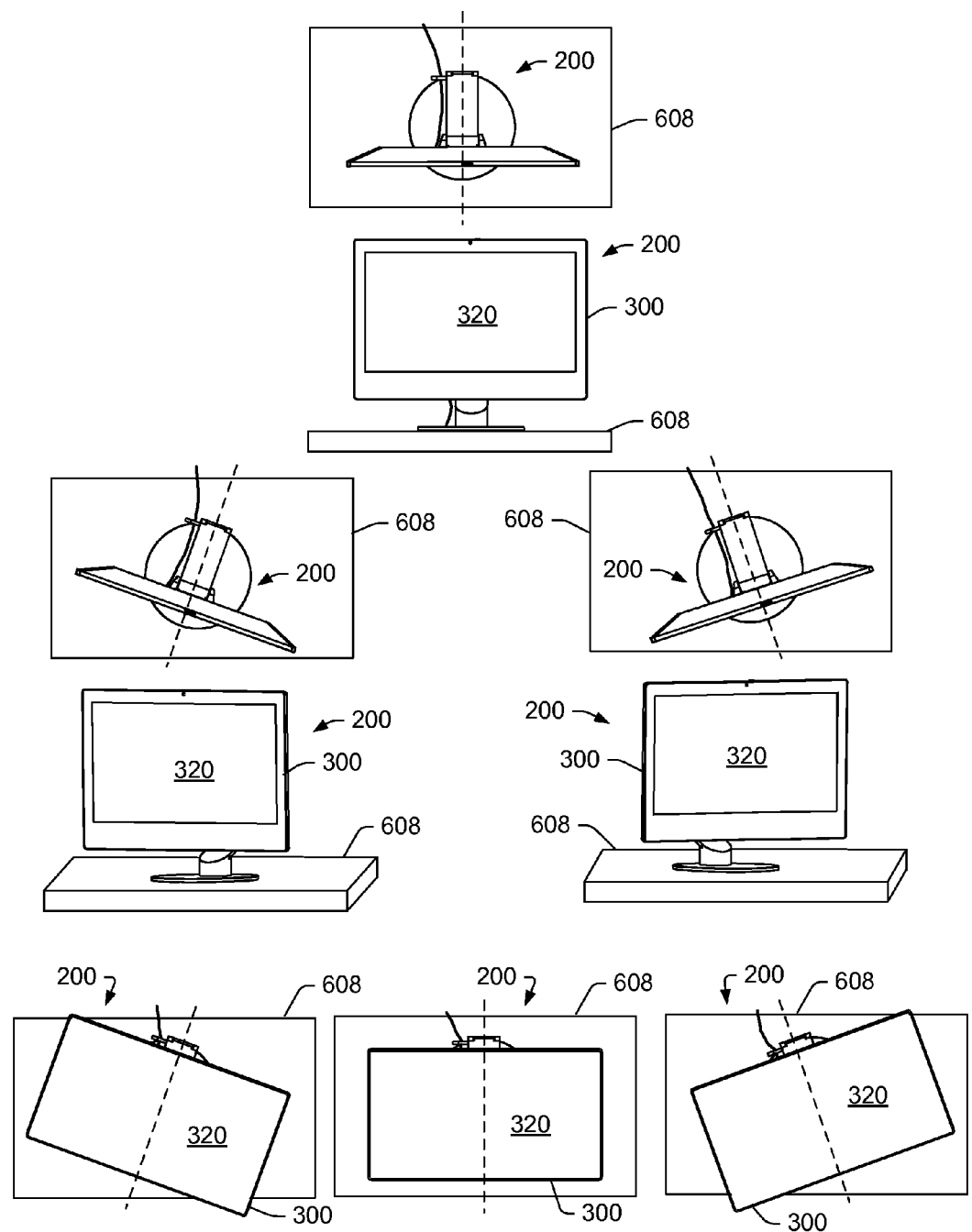
FIG. 6 is a series of views of an example of a system that includes a turntable with the system positioned in various orientations.

FIG. 6 shows various views of the assembly 200 in an approximately vertical orientation and in a touch mode orientation as being rotatable with respect to a surface 608 upon which the turntable 1500 is supported, which, in turn, supports the platform 400. As shown, the screen 320 of the monitor 300 may be positioned through use of the turntable 1500. For example, a user may show the screen 320 to another individual by rotating the monitor 300 (as coupled to the platform 400, which is rotatably coupled to the turntable 1500) without changing the orientation (e.g., while maintaining a vertical orientation, a touch mode orientation, a table orientation, etc.).

In the examples of FIG. 6, one or more cables may be connected to the monitor 300 and pass through the cable guide 780 where the cable guide 780 acts to help keep the one or more cables clear during rotation of the platform 400. In particular, as the cable guide 780 is located near the back of the assembly 200 it can guide cables and keep them clear of various components of the assembly 200 while the monitor 300 is positioned to one or more orientations, while the assembly 200 is rotated about the turntable 1500, etc.

As an example, a system can include an assembly and a monitor where a stop mechanism defines a maximum pivot angle of an arm of the assembly that maintains the center of mass of the monitor above a horizontal platform of the assembly for pivotable orientations of the monitor about an arm joint of a monitor mount of the assembly to which the arm is connected at a free end of the arm. In such an example, the turntable 1500, as part of the assembly 200, may operate with more stability (e.g., less wobble). In other words, if the center of mass of the monitor 300 were not above the platform 400, rotation of the platform 400 via the turntable 1500 would sweep the center of mass of the monitor 300 about a large radius arc (e.g., where that radius exceeds the radius of the platform 400). Inadvertent contact between the monitor 300 and an object during rotation, binding of one or more cables connected to the monitor during rotation, touching of the screen 320 of the monitor 300 during or after rotation, etc. could each cause the assembly 200 to be unstable, topple, etc. As an example, a turntable stand assembly for a monitor may provide for a wide range of orientations as to a screen of the monitor as well as for rotation of the screen about a vertical axis of the turntable stand platform even where the monitor mounted to the turntable stand assembly has a mass that exceeds that of the turntable stand assembly (e.g., the platform 400, the column 620, the extension 640, the arm 700, the monitor mount 800, etc.).

Figure 7:
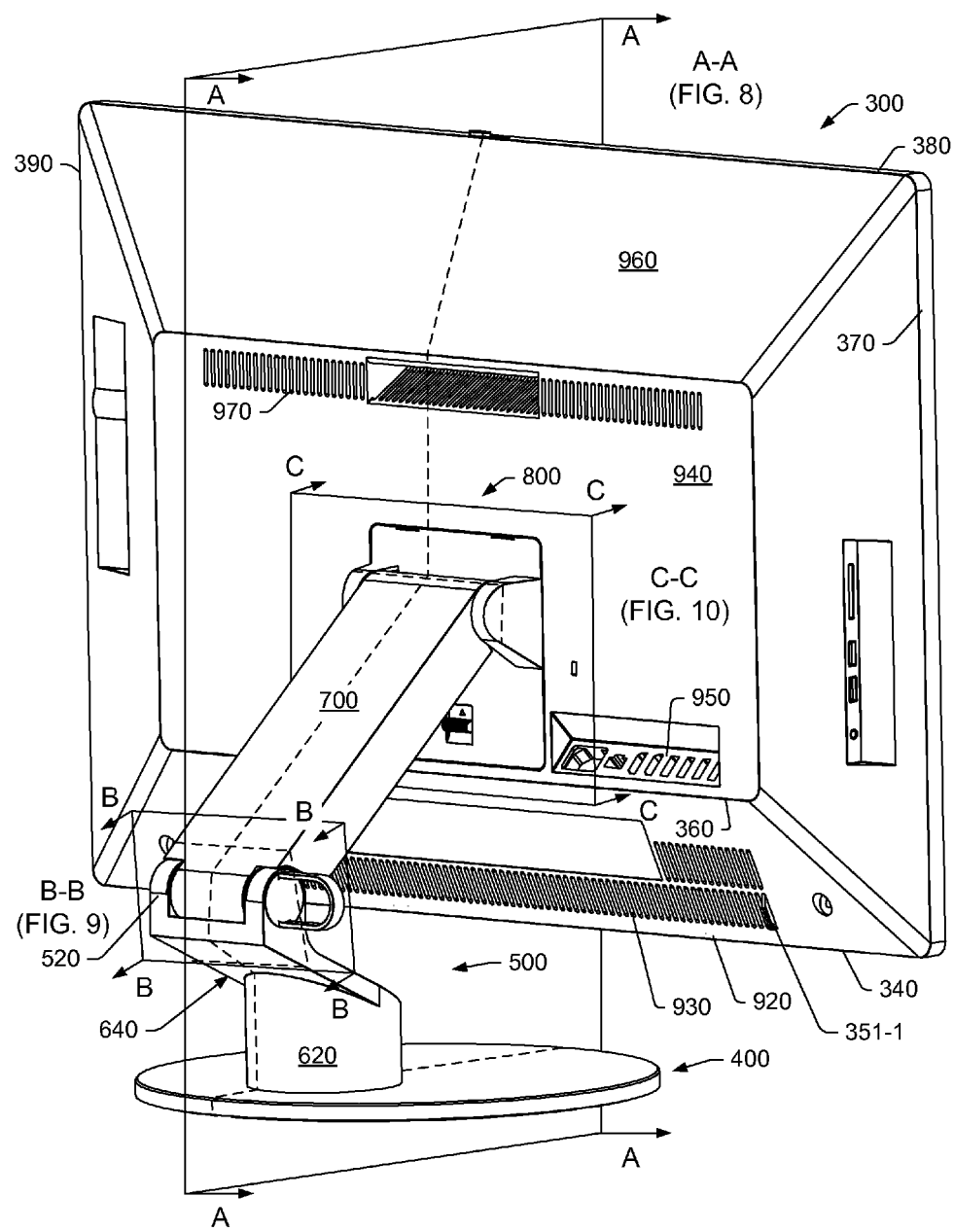
FIG. 7 is a perspective view of an example of a monitor mounted to an assembly.
Figure 8:
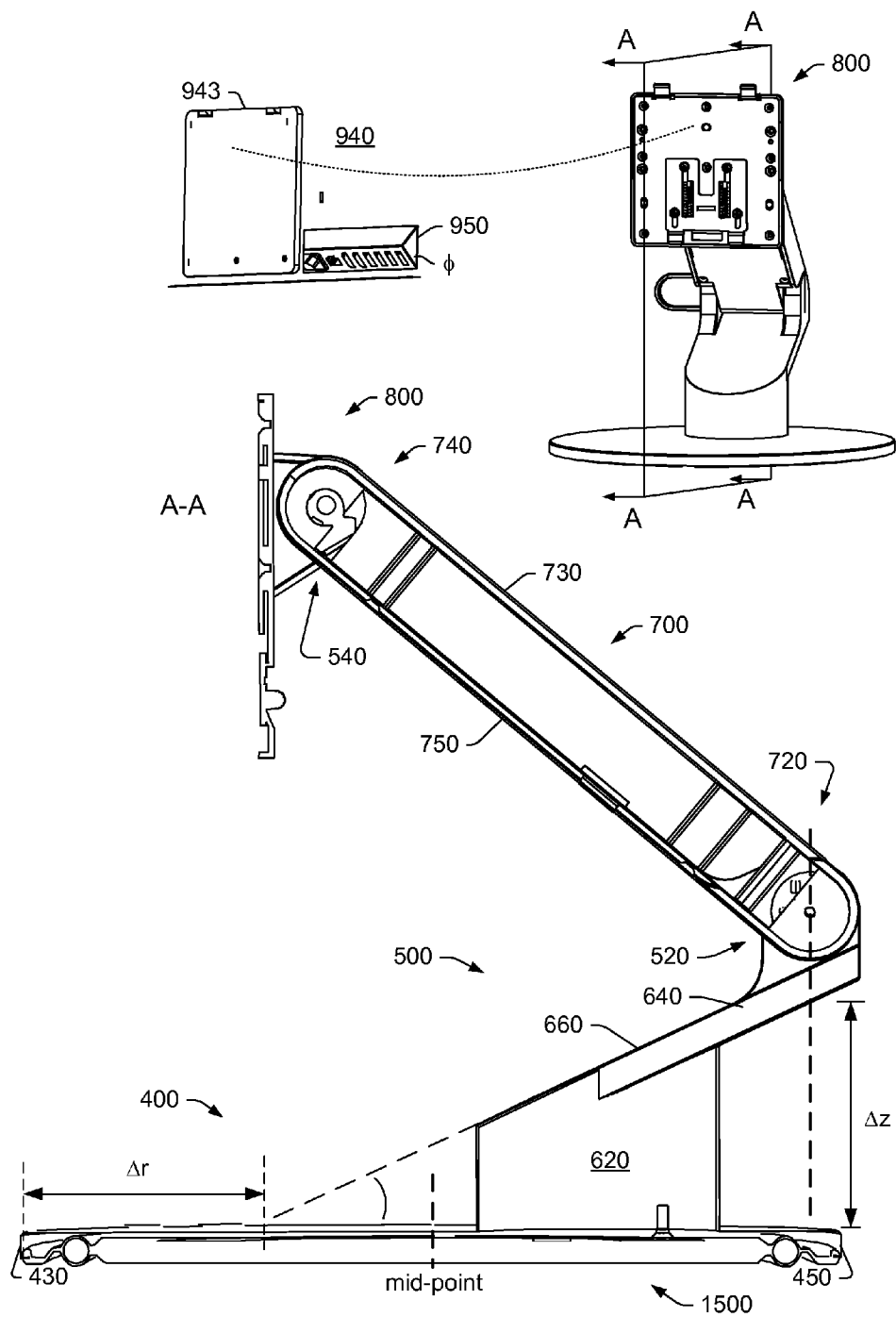
FIG. 8 is a series of views of an example of an assembly.
Figure 9:
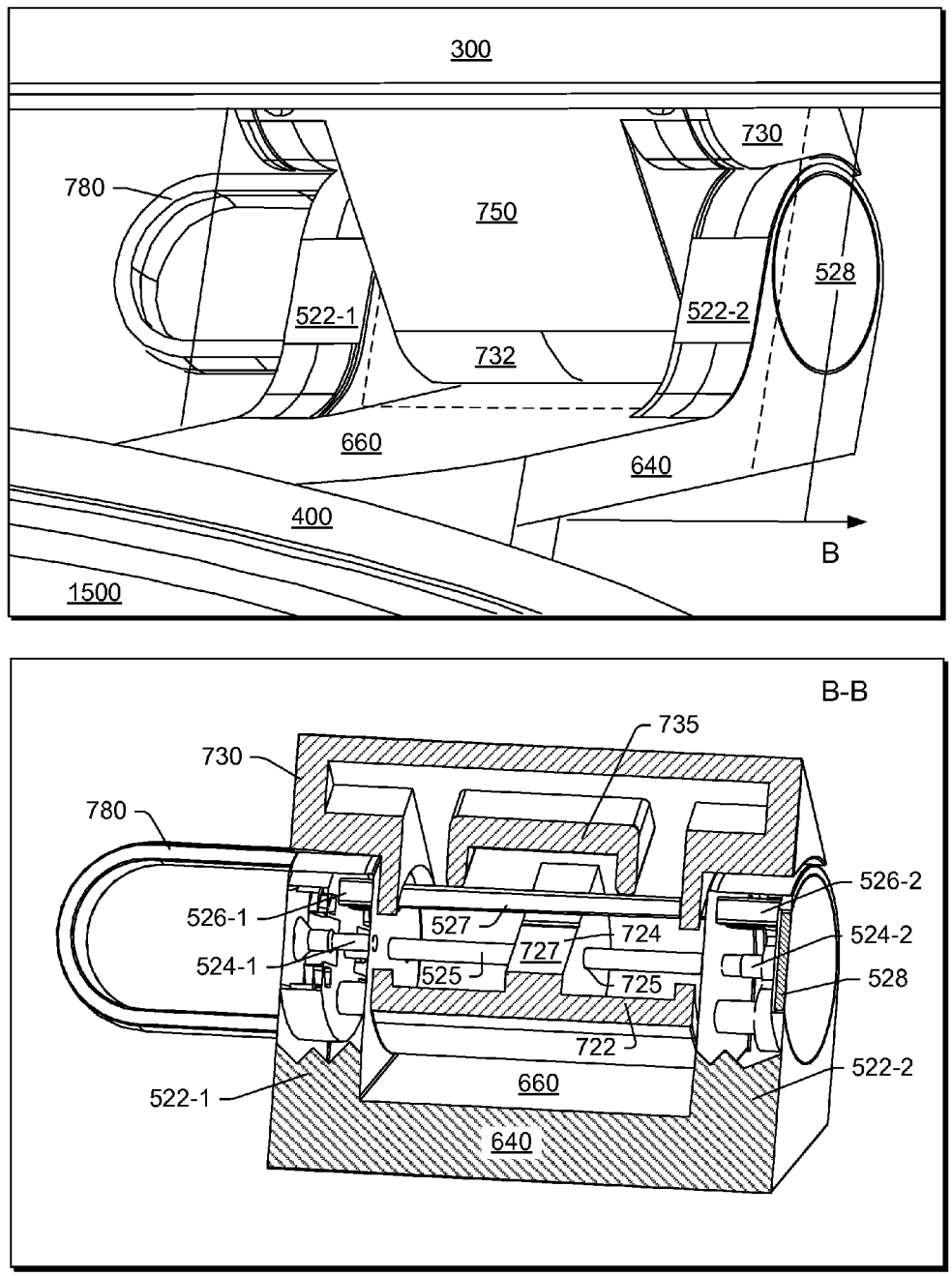
FIG. 9 is a series of views of an example of an assembly.
Figure 10:
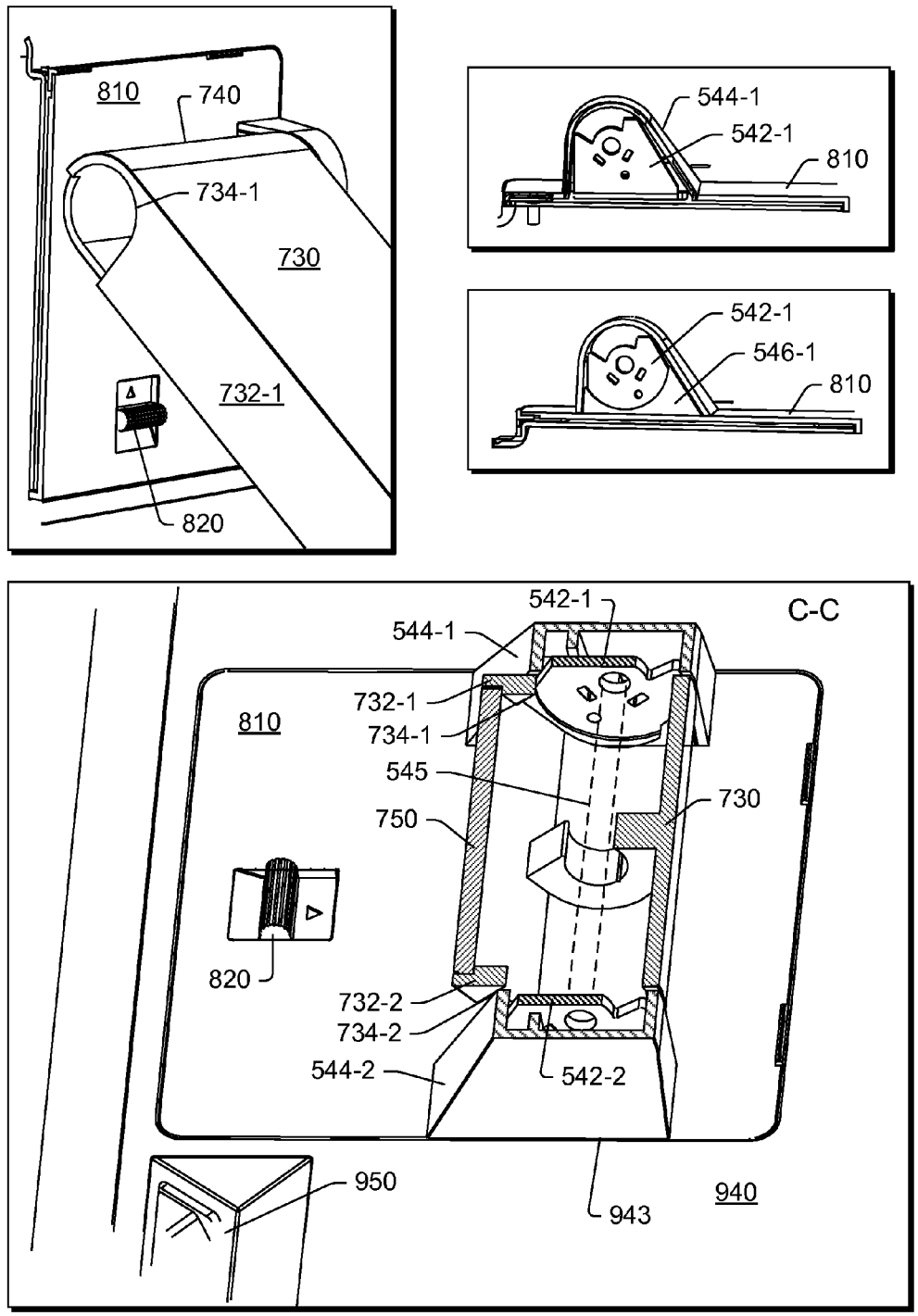
FIG. 10 is a series of views of an example of an assembly.

FIG. 7 shows a perspective view of the assembly 200 and the monitor 300 along with cutting planes A (along lines A-A), B (along lines B-B) and C (along lines C-C), corresponding cross-sectional or cut-away views are shown in FIG. 8, FIG. 9 and FIG. 10, respectively. FIG. 7 also shows vents 970 in the surface 940 and a bumper 351-1, which may be, for example, formed of an elastomer with a portion that may be received by a vent slot to secure the bumper 351-1 to the monitor 300; noting that one or more other bumpers may be secured to the monitor (e.g., 351-2, 351-3, etc.). In such an example, the bumper 351-1 may be received by a vent slot of the vents 930, for example, to define a clearance between a surface and the vents 930 to help ensure flow of air to the vents 930 for purposes of providing air flow within the monitor 300, for example, to assist with cooling, at least in part via convection of air within the monitor 300 (e.g., from the lower vents 930 to the upper vents 970).

FIG. 8 shows a cut-away view of the assembly 200 including the turntable 1500 along with a perspective view of a portion of the surface 940 as including the recess 943 and a perspective view of the assembly 200 showing a face and various features thereof of the mount 800 of the assembly 200 (e.g., a spring-biased sliding plate, prongs, etc.).

In the example of FIG. 8, the arm 700 is shown as including an upper portion 730 and a lower portion 750. For example, the upper portion 730 may be made of a rigid material such as a metal or an alloy and formed as a box (e.g., with three sides) with a lower opening and the lower portion 750 may be a cover made of a plastic or other material that can be coupled to cover the lower opening of the upper portion 730. As an example, the upper portion 730 may be die-cast as a unitary component with the pivot end 720 and the free end 740. In such an example, the lower portion 750 may be a plastic cover that snaps to or otherwise is securable to the upper portion 730, for example, for removal to access one or more features of the assembly 200.

As shown in the example of FIG. 8, an axis of the arm joint 520 is located vertically above the platform 400 and the column 620 of the support 500 is located between an approximate mid-point of the platform 400 and the back end 450 of the platform 440. As an example, the column 620 and the extension 640 may be die-cast as a unitary component (e.g., die-cast metal, alloy, etc.), for example, that can be connected to the platform 400 (e.g., via bolts, etc.).

As an example, the mid-point of the platform 400 may correspond to a vertical axis of the platform 400 about which the platform 400 may rotate via the turntable 1500. As shown in the example of FIG. 8, the rolling elements 1510 of the turntable 1500 are located in an annular socket defined by the lower race 1520 and the upper race 1540.

As shown in the example of FIG. 8, the extension 640 is disposed at an angle where a line extending forward from the extension intersects the platform 400 at an intersection point while providing a margin between the intersection point and the end 430 of the platform 400. When the arm 700 is in a lowermost position, a centerline extending between the arm joint 520 and the arm joint 540 extends to an intersection point closer to the end 430 of the platform 400 and, when a monitor is attached to the arm 700 via the monitor mount 800 and in a touch mode orientation, a centerline of the monitor may extend past the end 430 of the platform 400, for example, to allow one or more rubber bumpers attached to the monitor to contact a support surface upon which the platform 400 is supported (see, e.g., FIG. 11).

FIG. 9 shows a perspective view of a portion of the assembly 200 and a cut-away view of the portion of the assembly 200. As shown in the example of FIG. 9, the arm joint 520 has a U-shape with an axle support 522-1 and an axle support 522-2, which support an axle 525 via axle sockets 524-1 and 524-2 about which the arm 700 pivots at its pivot end 720. As shown, the axle supports 522-1 and 522-2 also support a bar 527 via bar sockets 526-1 and 526-2, which are part of a stop mechanism to limit pivoting of the arm 700 about the axle 525. For example, the arm 700 includes an internal block 724 that extends from an end wall 722 and that includes an aperture 725 for passage of the axle 525 and a stop surface 727 that can contact the bar 527 to define a maximum pivot angle for the arm 700 with respect to the arm joint 520 of the support 500.

In the example of FIG. 9, the arm joint 520 includes a cap 528 as a cover on one side and the cable guide 780 on an opposing side. Further, the example of FIG. 9 shows the arm 700 as including an internal brace 735 to provide the arm 700 with additional structural integrity, for example, to support a monitor mounted to the free end 740 of the arm 700 (e.g., via the mount 800).

As an example, the axle supports 522-1 and 522-2 may be part of the extension 640 of the support 500, for example, where the extension 640 and the axle supports 522-1 and 522-2 may be die-cast as a unitary component, which may also include the column 620.

FIG. 10 shows various views of the assembly 200 that include at least a portion of the mount 800. In the example of FIG. 10, the arm 700 is shown as including a side wall 732-1 with an opening 734-1 and an opposing side wall 732-2 with an opening 734-2. As shown, the mount 800 includes a main plate 810 and an actuator 820 that may slide to move a spring-biased plate for latching and unlatching the mount 800 from a monitor (e.g., where one or more prongs of the spring-biased plate may engage one or more sockets of the recess 943 of the monitor 300).

In the example of FIG. 10, the mount 800 includes supports 542-1 and 542-2, outer covers 544-1 and 544-2 and inner covers 546-1 and 546-2. As an example, the supports 542-1 and 542-2 may be bolted to the main plate 810 of the mount 800 (e.g., to form, in part, the arm joint 540). As shown, the supports 542-1 and 542-2 may support a cross-member 525 (see dashed lines), which may be an axle with threaded ends that receive nuts to apply a compressive force. Such a compressive force may be applied to the upper portion 730 of the arm 700 to allow for pivoting of the main plate 810 of the mount 800, for example, to pivot a monitor about the arm joint 540 and to hold the mount 800 at a particular pivot angle with the monitor attached thereto.

Figure 11:
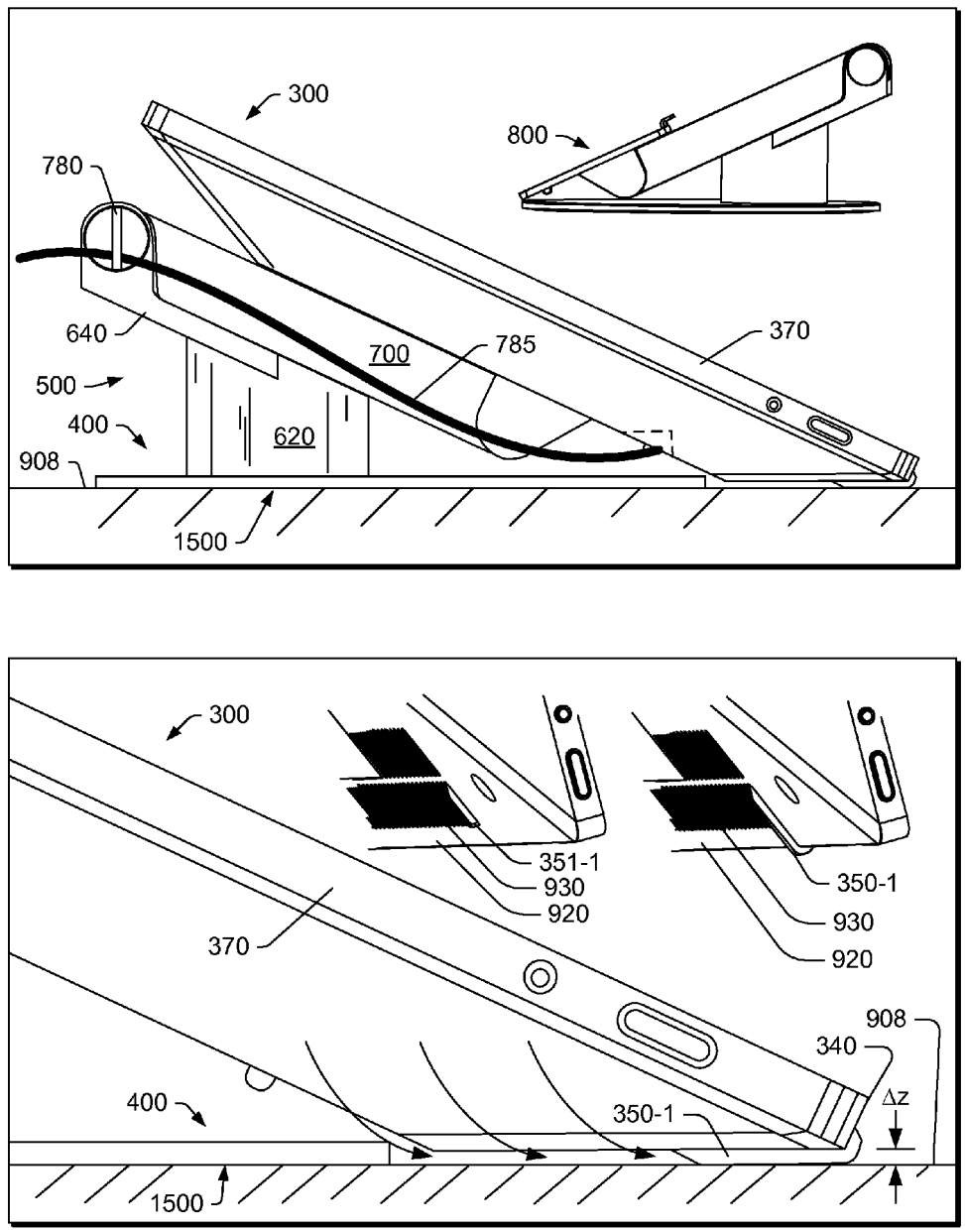
FIG. 11 is a series of views of an example of a monitor mounted to an assembly.

FIG. 11 shows side views of the assembly 200 where an upper view shows the assembly 200 with the monitor 300 along with a cable 785 extending from the monitor 300 and through the cable guide 780 and where a lower view shows the assembly 200 with the monitor 300 in a touch mode orientation as being supported in part by a bumper 350-1 or 351-2 or bumpers that provide a clearance with respect to a surface 908, for example to allow for flow of air to the vents 930.

As shown in FIG. 11, the cable 785 is connected to the monitor 300 via a connector disposed in the connector recess 950 (see, e.g., dashed line) and passes through the cable guide 780. For example, the cable 785 may be a power cable that provides power to the monitor 300. As mentioned, a connector disposed in the connector recess 950 may be disposed at an angle (see, e.g., the angle φ in FIG. 8) to facilitate guidance of a cable or cables by the cable guide 785. The angle may facilitate cable guidance (e.g., sliding, etc.) as the monitor 300 is adjusted from one orientation to another orientation. For example, consider moving from the table orientation to the touch mode orientation where the angle of a connector directs a cable connected thereto toward the cable guide 785.

As shown in FIG. 11, the bumper 350-1 (e.g., or the bumper 351-1) provides a clearance (Δz) between the surface 920 and the surface 908 sufficient for flow of air to the vents 930 (e.g., vent slots in the surface 920). FIG. 11 also shows a gap between the platform 400 and the monitor 300 (e.g., and the main plate 810 of the mount 800). As mentioned, one or more bumpers may provide a suitable amount of resistance to sweeping responsive to rotation of the platform 400 about the turntable 1500. For example, the bumper 350-1 or the bumper 351-1 may provide frictional force with respect to the surface 908 that may help in rotatably positioning the monitor 300, maintaining a rotated position of the monitor 300, etc.

As an example, a system can include a horizontal platform that includes a perimeter and a vertical axis; a circular turntable coupled to the horizontal platform for rotation of the platform about the vertical axis; a support that includes a column, an extension and an arm joint disposed on the extension, where the column extends vertically from the horizontal platform and where the extension extends from the column at an acute angle and positions the arm joint vertically above the horizontal platform and toward the perimeter of the horizontal platform; a monitor mount that comprises an arm joint; a monitor that comprises a computing device and a touch screen, the monitor being mountable to the monitor mount; and an arm coupled at a pivot end to the arm joint of the support and coupled at a free end to the arm joint of the monitor mount, the monitor mount being pivotable about the free end of the arm. In such an example, the circular turntable can include a circumference where, at the horizontal platform, the column includes a perimeter located within the circumference of the circular turntable. As an example, a circular turntable can include rolling elements disposed between races.

As an example, a horizontal platform can include a front end, a back end and a midpoint located approximately halfway between the front end and the back end where, at the horizontal platform, a column is positioned between the midpoint and the back end of the horizontal platform. In such an example, a monitor mounted to a monitor mount supported by an arm and a support on the platform may be positioned in a vertical orientation with respect to the platform such that a touch screen of the monitor is positionable in orientations only between the mid-point and the front end of the horizontal platform.

As an example, a mass of a monitor may exceed a combined mass of a circular turntable, a horizontal platform, a support, a monitor mount and an arm that provide for support of the monitor (e.g., in various orientations in which rotation of the monitor may be achieved by rotation of the platform via the turntable).

As an example, at least a column and an extension of a support may be a unitary component (e.g., die-cast, etc.). As an example, bolts may be provided and used to bolt the unitary component to a horizontal platform, for example, where the horizontal platform is rotatable about a vertical axis via a turntable coupled to the horizontal platform.

As an example, an arm can include an upper component and a detachable lower component, for example, where the upper component includes a box shape having an opening and where the detachable lower component covers the opening. In such an example, the upper component may be die-cast metal and the lower component may be plastic.

As an example, an arm joint can include an axle and a bar, where the axle defines a pivot axis, where a pivot end of an arm includes a block, where the block includes an aperture and a stop surface, where the aperture receives the axle and where contact between the bar and the stop surface define a maximum pivot angle of the arm about the pivot axis. As an example, a maximum pivot angle of an arm may be approximately 55 degrees.

As an example, contact between a surface located between a pivot end and a free end of an arm and a surface of a support may define a minimum pivot angle of the arm. As an example, a minimum pivot angle of an arm may be approximately minus 25 degrees (e.g., with respect to a horizontal plane that passes through the pivot end of the arm).

As an example, an arm of an assembly may have a maximum pivot angle of approximately 55 degrees and a minimum pivot angle of approximately minus 25 degrees with respect to a horizontal plane that passes through a pivot axis of the pivot end of the arm. For example, consider an arm with a free end and a pivot end where the pivot end is received by an arm joint of a support of a platform where the platform may be coupled to a turntable. In such an example, the free end of the arm may be pivoted about the arm joint downwardly to about minus 25 degrees (e.g., to positioned a monitor mounted via a monitor mount to the free end of the arm) and may be pivoted about the arm joint upwardly to about 55 degrees (e.g., to positioned a monitor mounted via a monitor mount to the free end of the arm).

As an example, a system can include a monitor mounted to a monitor mount wherein, to support the monitor in a touch mode orientation, a lower surface located between a pivot end and a free end of an arm and an upper surface of a support contact and a back surface of the monitor and an upper surface of the arm contact. In such a manner, the arm is "sandwiched" between the monitor and the support surfaces, which may provide additional stability to the monitor in the touch mode orientation, for example, where a user rotates the monitor by rotating a platform to which the support is connected and to which a turntable is coupled.

As an example, a system can include a stop mechanism that defines a maximum pivot angle of an arm that maintains the center of mass of the monitor above a horizontal platform for pivotable orientations of a monitor about an arm joint of a monitor mount and for rotatable orientations of the horizontal platform about the vertical axis.

As an example, a system may include a monitor mounted to a turntable stand assembly via a monitor mount where the turntable stand assembly includes a cable guide that extends from an arm joint of a support where the support is connected to a platform and where the platform is rotatable via a turntable. In such an example, the monitor can include a lower edge, an upper edge, and a back side where the back side includes cable connectors disposed at an angle to angle cables connected thereto toward the upper edge. In such an example, a cable connected to one of the cable connectors of the monitor cable can be slidably supported by the cable guide for pivotable orientations of the monitor with respect to an arm joint of the monitor mount and the arm joint of the support and the cable can also be supported by the cable guide for rotatable orientations of the platform (e.g., about a vertical axis of the platform).

As an example, a system can include a monitor and a turntable stand assembly to position the monitor in: a touch mode orientation where a surface located between a pivot end and a free end of an arm and a surface of a support contact to support the monitor; a vertical orientation where a lower edge bumper of the monitor contacts a platform to support the monitor; a free orientation where the arm supports the monitor; and a table orientation where the arm supports the monitor parallel to the platform at a maximum pivot angle of the arm about an arm joint of the support. In such an example, the turntable stand assembly can provide for rotation of the platform via a turntable, for example, to thereby rotate the monitor (e.g., for viewing, for touching, for positioning tokens, etc.). For example, in the table orientation, multiple users may be seated about the system where the platform may be rotated to a number of degrees to position the monitor (e.g., a monitor screen) with respect to one of the users. Where a game is being played that involves taking turns, once that user is finished with her turn, the platform may be rotated to position the monitor with respect to another one of the users.

As an example, a perimeter of a platform may include a shape selected from a conic section, a semi-conic section, an oval, a semi-oval, a stadium and a semi-stadium. As an example, a perimeter of a horizontal platform may be circular. As an example, a perimeter of a turntable may be circular.

As an example, a system can include a monitor and a turntable stand assembly where the monitor includes airflow vents and a bumper. In such an example, the bumper can include a first surface to support the monitor in a vertical orientation by contact between the first surface and a horizontal platform of the turntable stand assembly and a second surface to support the monitor in a touch mode orientation by contact between the second surface and a horizontal surface (e.g., of a table, a desk, etc.) that supports the turntable stand assembly and to create a clearance between the horizontal surface and the airflow vents.

As an example, an assembly can include a horizontal platform that includes a perimeter and a vertical axis; a circular turntable coupled to the horizontal platform for rotation of the platform about the vertical axis; a support that includes a column, an extension and an arm joint disposed on the extension, where the column extends vertically from the horizontal platform and where the extension extends from the column at an acute angle and positions the arm joint vertically above the horizontal platform and toward the perimeter of the horizontal platform; a monitor mount that includes an arm joint; and an arm coupled at a pivot end to the arm joint of the support and coupled at a free end to the arm joint of the monitor mount, the monitor mount being pivotable about the free end of the arm.

As an example, a monitor stand assembly can be configured to orient a monitor in a touch mode orientation where a touch screen of the monitor is angled at an ergonomic angle for receiving multi touch input. In such an example, the footprint of the monitor stand assembly (e.g., area) may be smaller than the touch screen area of the monitor and, for example, the mass of the monitor stand assembly may be less than the mass of the monitor. As an example, a touch mode orientation may be a storage orientation for a monitor, for example, as it may be the most stable orientation for the monitor (e.g., consider a monitor supported against an arm which is supported against an angled portion of a support (e.g., an extension, a column, etc.).

As an example, a monitor stand assembly may include a hinge or pivot axis for an arm that is offset from a centroid of a platform of the assembly in a vertical direction and in a lateral direction, for example, via an extension that extends from a column of a support attached to the platform. In such an example, the column may have a height in centimeters while the extension extends at an angle to amplify the height (e.g., a centimeter or more) of the hinge or arm joint. As an example, the angle may be an ergonomic angle that corresponds to a touch mode orientation of a monitor.

As an example, a monitor stand assembly may be configured to achieve various monitor orientations while maintaining the center of mass of a monitor above a platform of the assembly. For example, a platform of an assembly may be made as small as possible (e.g., diameter for a circular platform) while also providing a safety or stability margin (e.g., an annular ring) about which the center of mass of the monitor does not move above. In such an example, the platform may be mounted to a turntable where rotation of the platform via the turntable maintains the center of mass of the monitor above the platform and, for example, within an inner boundary of a safety or stability margin of the platform.

As an example, a turntable platform may be more stable when compared to a turntable support mounted on a platform. For example, consider rotation of a support that is not centered on the platform, which may move the center of mass of a monitor to a position that is not above the platform (e.g., to an unstable position). In such a scenario, to avoid instability, the platform may be enlarged (i.e., its footprint increased). In contrast, where the center of mass of a monitor is above a turntable platform it will remain above the turntable platform as the turntable platform is rotated.

As an example, a support that includes an extension to locate an arm joint near a back end of a perimeter of a platform to which the support is attached may be more stable when compared to a central vertical support that locates an arm joint vertically over a central region of a platform. For example, in the latter arrangement, as a monitor is moved forward, the center of mass of the monitor will move forward and may move close to or past an edge of the platform. In contrast, in the former arrangement, where an arm joint is displaced toward the back end of a platform, a larger margin exists for forward movement of the center of mass of the monitor (e.g., which may remain over the platform).

As an example, a monitor may be part of a computing device (e.g., a tablet, touch monitor computing device, monitor computing device, etc.) or may be a separate device connected to a computing device via a wired connection, a wireless connection or a combination of wired and wireless connections. As an example, a monitor may be connected to a network for display of information received via the network and optionally as an input device to transmit information via the network.

With respect to mass, a monitor may have a mass on the order of about a kilogram to about 10 kilograms, or more (e.g., 1 kg to about 10 kg, or more).

As an example, a monitor can include various circuitry such as one or more processors, memory and one or more interfaces. In general, a machine or monitor may be considered an information handling device (e.g., for at least display of information). Such a device may be configured for one or more purposes selected from a variety of purposes (e.g., media, gaming, drafting, computing, etc.). As an example, an interface may include a power interface, optionally for charging a battery of a machine. As an example, a screen may be considered a visual interface, optionally with touch capabilities to receive input via touch, whether by a user finger or other implement. Further, as an example, touch can include multi-touch and optionally gestures.

The term "circuit" or "circuitry" is used in the summary, description, and/or claims. As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions. Such circuitry may optionally rely on one or more computer-readable media that includes computer-executable instructions. As described herein, a computer-readable medium may be a storage device (e.g., a memory card, a storage disk, etc.) and referred to as a computer-readable storage medium.

Figure 12:
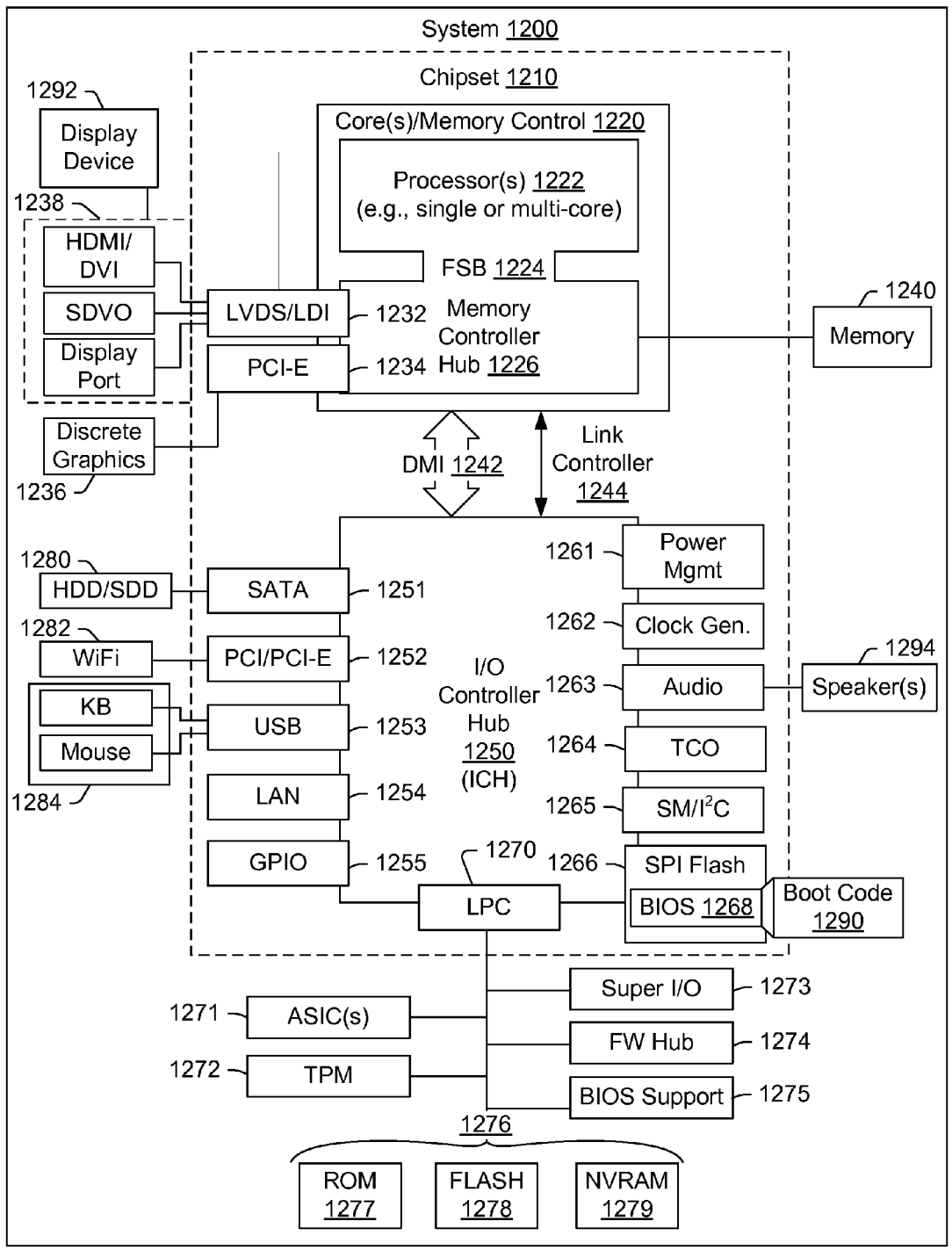
FIG. 12 is a diagram of an example of a machine.

While various examples of circuits or circuitry have been discussed, FIG. 12 depicts a block diagram of an illustrative computer system 1200. The system 1200 may be a computer system sold by Lenovo (US) Inc. of Morrisville, N.C. (e.g., a ThinkStation® system); however, as apparent from the description herein, a satellite, a base, a server or other machine may include other features or only some of the features of the system 1200. As described herein, a monitor or machine such as the monitor 300 may include at least some of the features of the system 1200.

As an example, a monitor may include features such as one or more of the features included in one of the LENOVO® IDEADCENTRE® or THINKCENTRE® "all-in-one" computing devices (e.g., sold by Lenovo (US) Inc. of Morrisville, N.C.). For example, the LENOVO® IDEADCENTRE® A720 computing device includes an Intel® Core i7 processor, a 27 inch frameless multi-touch display (e.g., for HD resolution of 1920×1080), a NVIDIA® GeForce® GT 630M 2 GB graphics card, 8 GB DDR3 memory, a hard drive, a DVD reader/writer, integrated Bluetooth® and 802.11b/g/n Wi-Fi®, USB connectors, a 6-in-1 card reader, a webcam, HDMI in/out, speakers, and a TV tuner.

As shown in FIG. 12, the system 1200 includes a so-called chipset 1210. A chipset refers to a group of integrated circuits, or chips, that are designed to work together. Chipsets are usually marketed as a single product (e.g., consider chipsets marketed under the brands INTEL®, AMD®, etc.).

In the example of FIG. 12, the chipset 1210 has a particular architecture, which may vary to some extent depending on brand or manufacturer. The architecture of the chipset 1210 includes a core and memory control group 1220 and an I/O controller hub 1250 that exchange information (e.g., data, signals, commands, etc.) via, for example, a direct management interface or direct media interface (DMI) 1242 or a link controller 1244. In the example of FIG. 12, the DMI 1242 is a chip-to-chip interface (sometimes referred to as being a link between a "northbridge" and a "southbridge").

The core and memory control group 1220 include one or more processors 1222 (e.g., single core or multi-core) and a memory controller hub 1226 that exchange information via a front side bus (FSB) 1224. As described herein, various components of the core and memory control group 1220 may be integrated onto a single processor die, for example, to make a chip that supplants the conventional "northbridge" style architecture.

The memory controller hub 1226 interfaces with memory 1240. For example, the memory controller hub 1226 may provide support for DDR SDRAM memory (e.g., DDR, DDR2, DDR3, etc.). In general, the memory 1240 is a type of random-access memory (RAM). It is often referred to as "system memory".

The memory controller hub 1226 further includes a low-voltage differential signaling interface (LVDS) 1232. The LVDS 1232 may be a so-called LVDS Display Interface (LDI) for support of a display device 1292 (e.g., a CRT, a flat panel, a projector, etc.). A block 1238 includes some examples of technologies that may be supported via the LVDS interface 1232 (e.g., serial digital video, HDMI/DVI, display port). The memory controller hub 1226 also includes one or more PCI-express interfaces (PCI-E) 1234, for example, for support of discrete graphics 1236. Discrete graphics using a PCI-E interface has become an alternative approach to an accelerated graphics port (AGP). For example, the memory controller hub 1226 may include a 16-lane (×16) PCI-E port for an external PCI-E-based graphics card. A system may include AGP or PCI-E for support of graphics. As described herein, a display may be a sensor display (e.g., configured for receipt of input using a stylus, a finger, etc.). As described herein, a sensor display may rely on resistive sensing, optical sensing, or other type of sensing.

The I/O hub controller 1250 includes a variety of interfaces. The example of FIG. 12 includes a SATA interface 1251, one or more PCI-E interfaces 1252 (optionally one or more legacy PCI interfaces), one or more USB interfaces 1253, a LAN interface 1254 (more generally a network interface), a general purpose I/O interface (GPIO) 1255, a low-pin count (LPC) interface 1270, a power management interface 1261, a clock generator interface 1262, an audio interface 1263 (e.g., for speakers 1294), a total cost of operation (TCO) interface 1264, a system management bus interface (e.g., a multi-master serial computer bus interface) 1265, and a serial peripheral flash memory/controller interface (SPI Flash) 1266, which, in the example of FIG. 12, includes BIOS 1268 and boot code 1290. With respect to network connections, the I/O hub controller 1250 may include integrated gigabit Ethernet controller lines multiplexed with a PCI-E interface port. Other network features may operate independent of a PCI-E interface.

The interfaces of the I/O hub controller 1250 provide for communication with various devices, networks, etc. For example, the SATA interface 1251 provides for reading, writing or reading and writing information on one or more drives 1280 such as HDDs, SDDs or a combination thereof. The I/O hub controller 1250 may also include an advanced host controller interface (AHCI) to support one or more drives 1280. The PCI-E interface 1252 allows for wireless connections 1282 to devices, networks, etc. The USB interface 1253 provides for input devices 1284 such as keyboards (KB), one or more optical sensors, mice and various other devices (e.g., microphones, cameras, phones, storage, media players, etc.). On or more other types of sensors may optionally rely on the USB interface 1253 or another interface (e.g., I²C, etc.). As to microphones, the system 1200 of FIG. 12 may include hardware (e.g., audio card) appropriately configured for receipt of sound (e.g., user voice, ambient sound, etc.).

In the example of FIG. 12, the LPC interface 1270 provides for use of one or more ASICs 1271, a trusted platform module (TPM) 1272, a super I/O 1273, a firmware hub 1274, BIOS support 1275 as well as various types of memory 1276 such as ROM 1277, Flash 1278, and non-volatile RAM (NVRAM) 1279. With respect to the TPM 1272, this module may be in the form of a chip that can be used to authenticate software and hardware devices. For example, a TPM may be capable of performing platform authentication and may be used to verify that a system seeking access is the expected system.

The system 1200, upon power on, may be configured to execute boot code 1290 for the BIOS 1268, as stored within the SPI Flash 1266, and thereafter processes data under the control of one or more operating systems and application software (e.g., stored in system memory 1240). An operating system may be stored in any of a variety of locations and accessed, for example, according to instructions of the BIOS 1268. Again, as described herein, a satellite, a base, a server or other machine may include fewer or more features than shown in the system 1200 of FIG. 12. Further, the system 1200 of FIG. 12 is shown as optionally include cell phone circuitry 1295, which may include GSM, CDMA, etc., types of circuitry configured for coordinated operation with one or more of the other features of the system 1200.

CONCLUSION

Although examples of methods, devices, systems, etc., have been described in language specific to structural features and/or methodological acts, it is to be understood that the subject matter defined in the appended claims is not necessarily limited to the specific features or acts described. Rather, the specific features and acts are disclosed as examples of forms of implementing the claimed methods, devices, systems, etc.

What is claimed is:

1. A system comprising:
   a horizontal platform that comprises a perimeter and a vertical axis;
   a circular turntable coupled to the horizontal platform for rotation of the platform about the vertical axis wherein the circular turntable comprises rolling elements disposed between races;
   a support that comprises
      a column,
      an extension and
      an arm joint disposed on the extension,
         wherein the column extends vertically from the horizontal platform and
         wherein the extension extends from the column at an acute angle and positions the arm joint vertically above the horizontal platform and toward the perimeter of the horizontal platform;
   a monitor mount that comprises an arm joint;
   a monitor that comprises a computing device and a touch screen, the monitor being mountable to the monitor mount; and
   an arm coupled at a pivot end to the arm joint of the support and coupled at a free end to the arm joint of the monitor mount, the monitor mount being pivotable about the free end of the arm wherein contact between a lower surface located between the pivot end and the free end of the arm and an upper surface of the support defines a minimum pivot angle of the arm and wherein a stop mechanism defines a maximum pivot angle of the arm that maintains the center of mass of the monitor above the horizontal platform for rotatable orientations of the horizontal platform about the vertical axis, and
      wherein a mass of the monitor is greater than a combined mass of the circular turntable, the horizontal platform, the support, the monitor mount and the arm.

2. The system of claim 1 wherein the horizontal platform comprises a front end, a back end and a midpoint located approximately halfway between the front end and the back end and wherein, at the horizontal platform, the column is positioned between the midpoint and the back end of the horizontal platform.

3. The system of claim 2 wherein the monitor is mounted to the monitor mount and wherein for a vertical orientation of the touch screen of the monitor with respect to the horizontal platform, the touch screen of the monitor is positionable in orientations only between the mid-point and the front end of the horizontal platform.

4. The system of claim 1 wherein at least the column and the extension of the support comprise a unitary component configured for attachment to the horizontal platform.

5. The system of claim 1 wherein the arm comprises an upper component and a detachable lower component, wherein the upper component comprises a box shape having an opening and wherein the detachable lower component covers the opening.

6. The system of claim 1 wherein the arm joint comprises an axle and a bar, wherein the axle defines a pivot axis, wherein the pivot end of the arm comprises a block, wherein the block comprises an aperture and a stop surface, wherein the aperture receives the axle and wherein contact between the bar and the stop surface define a maximum pivot angle of the arm about the pivot axis.

7. The system of claim 1 wherein the arm comprises a maximum pivot angle of approximately 55 degrees and wherein the minimum pivot angle is of approximately minus 25 degrees with respect to a horizontal plane that passes through a pivot axis of the pivot end of the arm.

8. The system of claim 1 wherein the monitor is mounted to the monitor mount and wherein, to support the monitor in a touch mode orientation, the lower surface located between the pivot end and the free end of the arm and the upper surface of the support contact each other and a back surface of the monitor and an upper surface of the arm contact each other.

9. The system of claim 1 wherein the stop mechanism maintains the center of mass of the monitor above the horizontal platform for pivotable orientations of the monitor about the arm joint of the monitor mount.

10. The system of claim 1 wherein the arm joint of the support comprises a cable guide.

11. The system of claim 10 wherein the monitor comprises a lower edge, an upper edge, and a back side that comprises cable connectors disposed at an angle to angle cables connected thereto toward the upper edge.

12. The system of claim 11 comprising a cable connected to one of the cable connectors of the monitor, wherein the monitor is mounted to the monitor mount, wherein the cable is slidably supported by the cable guide for pivotable orientations of the monitor with respect to the arm joint of the monitor mount and the arm joint of the support and wherein the cable is supported by the cable guide for rotatable orientations of the horizontal platform about the vertical axis.

13. The system of claim 1 comprising
   a touch mode orientation wherein the lower surface located between the pivot end and the free end of the arm and the upper surface of the support contact to support the monitor,
   a vertical orientation wherein a lower edge bumper of the monitor contacts the horizontal platform to support the monitor,
   a free orientation wherein the arm supports the monitor, and
   a table orientation wherein the arm supports the monitor parallel to the horizontal platform at a maximum pivot angle of the arm about the arm joint of the support.

14. The system of claim 1 wherein the perimeter of the horizontal platform comprises a shape selected from a group consisting of a conic section, a semi-conic section, an oval, a semi-oval, a stadium and a semi-stadium.

15. The system of claim 1 wherein the perimeter of the horizontal platform is circular.

16. The system of claim 1 wherein the monitor comprises airflow vents and a bumper wherein the bumper comprises a first surface to support the monitor in a vertical orientation by contact between the first surface and the horizontal platform and a second surface to support the monitor in a touch mode orientation by contact between the second surface and a horizontal surface that supports the circular turntable and to create a clearance between the horizontal surface and the airflow vents.

17. An assembly comprising:
   a horizontal platform that comprises a perimeter and a vertical axis;
   a circular turntable coupled to the horizontal platform for rotation of the platform about the vertical axis wherein the circular turntable comprises rolling elements disposed between races;

a support that comprises
- a column,
- an extension and
- an arm joint disposed on the extension,
- wherein the column extends vertically from the horizontal platform and
- wherein the extension extends from the column at an acute angle and positions the arm joint vertically above the horizontal platform and toward the perimeter of the horizontal platform;

a monitor mount that comprises an arm joint; and an arm coupled at a pivot end to the arm joint of the support and coupled at a free end to the arm joint of the monitor mount, the monitor mount being pivotable about the free end of the arm wherein contact between a lower surface located between the pivot end and the free end of the arm and an upper surface of the support defines a minimum pivot angle of the arm and wherein a stop mechanism defines a maximum pivot angle of the arm that maintains a center of mass of a monitor coupled to the monitor mount above the horizontal platform for rotatable orientations of the horizontal platform about the vertical axis, and wherein a mass of the monitor is greater than a combined mass of the circular turntable, the horizontal platform, the support, the monitor mount and the arm.

* * * * *